(12) United States Patent
Kalluru et al.

(10) Patent No.: US 12,057,174 B2
(45) Date of Patent: Aug. 6, 2024

(54) CHARGE LOSS COMPENSATION DURING READ OPERATIONS IN A MEMORY DEVICE

(71) Applicant: Micron Technology, Inc., Boise, ID (US)

(72) Inventors: Vivek Venkata Kalluru, San Jose, CA (US); Michele Piccardi, Cupertino, CA (US); Taehyun Kim, San Jose, CA (US); Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 17/669,073

(22) Filed: Feb. 10, 2022

(65) Prior Publication Data

US 2023/0057289 A1 Feb. 23, 2023

Related U.S. Application Data

(60) Provisional application No. 63/260,332, filed on Aug. 17, 2021.

(51) Int. Cl.
*G11C 16/26* (2006.01)
*G11C 16/04* (2006.01)
*G11C 16/28* (2006.01)
*G11C 16/34* (2006.01)

(52) U.S. Cl.
CPC ......... *G11C 16/26* (2013.01); *G11C 16/0483* (2013.01); *G11C 16/28* (2013.01); *G11C 16/3418* (2013.01); *G11C 16/3422* (2013.01); *G11C 16/3431* (2013.01); *G11C 16/3459* (2013.01)

(58) Field of Classification Search
CPC ..... G11C 16/26; G11C 16/0483; G11C 16/28; G11C 16/3418; G11C 16/3422; G11C 16/3431; G11C 16/3459
See application file for complete search history.

(56) References Cited

U.S. PATENT DOCUMENTS

| | | | |
|---|---|---|---|
| 2008/0181002 A1* | 7/2008 | Iioka ..................... | G11C 16/105 365/185.09 |
| 2010/0284219 A1* | 11/2010 | Kim .................... | G11C 16/3459 365/185.03 |
| 2015/0357043 A1* | 12/2015 | Im .......................... | G11C 16/32 365/185.11 |
| 2019/0130967 A1* | 5/2019 | Danjean .............. | G11C 11/5642 |
| 2020/0013467 A1* | 1/2020 | Yamada .............. | G11C 16/0483 |
| 2020/0381063 A1* | 12/2020 | Kavalipurapu ........ | G11C 16/32 |
| 2020/0402564 A1* | 12/2020 | Piccardi ............... | G11C 29/021 |

\* cited by examiner

*Primary Examiner* — Mushfique Siddique
(74) *Attorney, Agent, or Firm* — Lowenstein Sandler LLP

(57) ABSTRACT

Control logic in a memory device initiates a read operation on a memory array of the memory device and performs a calibration operation to detect a change in string resistance in the memory array. The control logic determines whether the change in string resistance is attributable to charge loss in the memory array, and responsive to determining that the change in string resistance is attributable to charge loss in the memory array, preforms the read operation using calibrated read voltage levels to read data from the memory array.

19 Claims, 7 Drawing Sheets

CHARGE LOSS COMPENSATION DURING READ OPERATIONS IN A MEMORY DEVICE

RELATED APPLICATION

This application claims the benefit of U.S. Provisional Patent Application Ser. No. 63/260,332, filed Aug. 17, 2021, which is herein incorporated by reference in its entirety.

TECHNICAL FIELD

Embodiments of the disclosure relate generally to memory sub-systems, and more specifically, relate to charge loss compensation during read operations in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
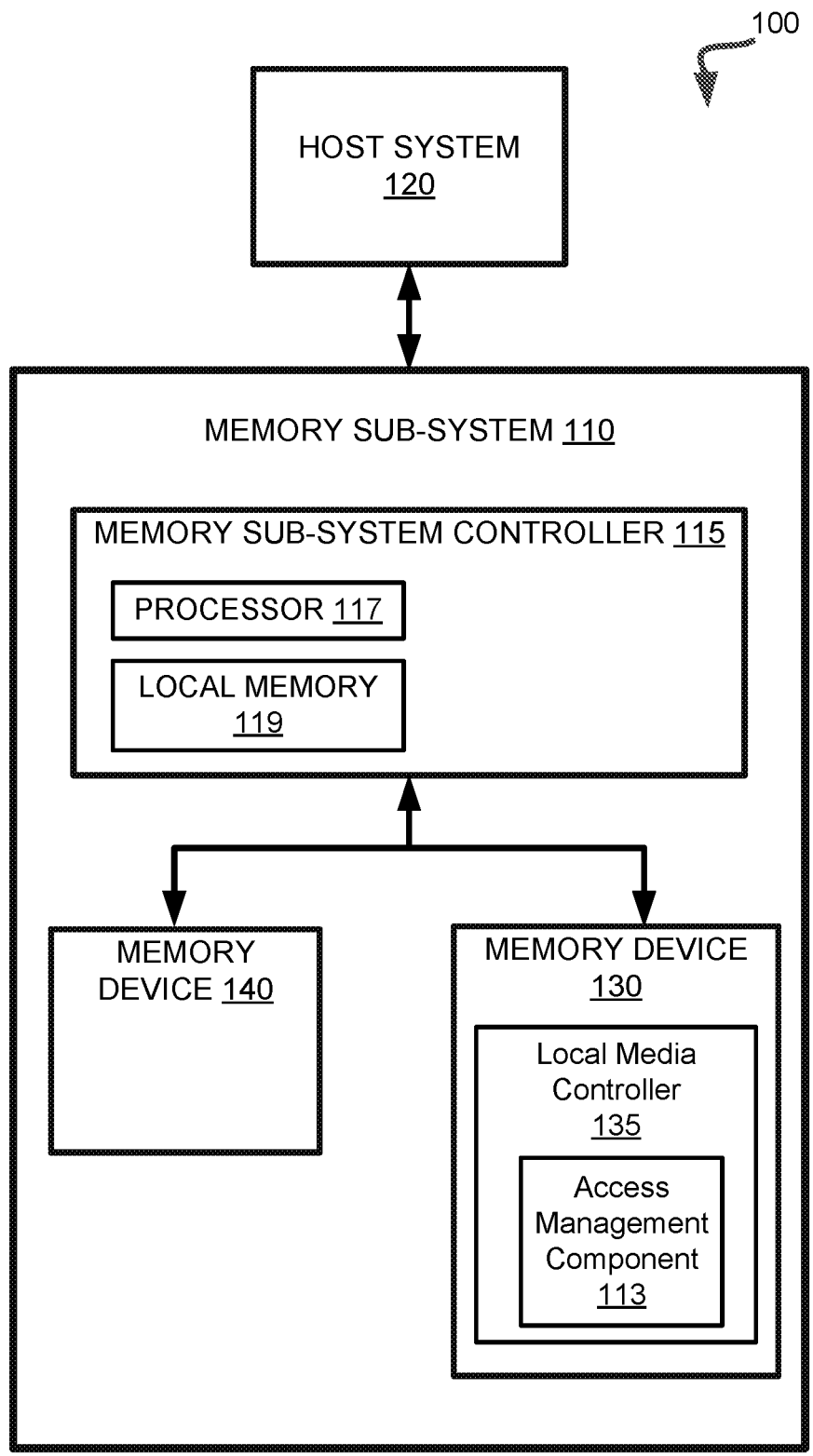
FIG. 1 illustrates an example computing system that includes a memory sub-system in accordance with some embodiments of the present disclosure.

Aspects of the present disclosure are directed to charge loss compensation during read operations in a memory device of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. A block hereinafter refers to a unit of the memory device used to store data and can include a group of memory cells, a word line group, a word line, or individual memory cells. Each block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines, which are commonly referred to as "word lines," often fabricated in common with the memory cells, so as to form an array of strings in a block of memory. The compact nature of certain non-volatile memory devices, such as 3D flash NAND memory, means word lines are common to many memory cells within a block of memory.

During a programming operation, a selected memory cell(s) can be programmed with the application of a programming voltage to a selected word line. In some cases, a series of incrementing voltage programming pulses is applied to the selected word line to increase a charge level, and thereby a threshold voltage, of each memory cell connected to that word line. After each programming pulse, or after a number of programming pulses, a program verify operation is performed to determine if the threshold voltage of the memory cell(s) has increased to a desired programming level. After the programming operation is complete, the programmed memory cell(s) can experience multiple forms of charge loss that can cause defects in the data retention characteristics of the memory cell(s), such as single bit charge loss, intrinsic charge loss, and quick charge loss. Quick charge loss (QLC) is the result of electrons trapped in a tunnel oxide layer, also referred to herein as a "band engineering (BE)" layer, after the application of a programming pulse moving back into the channel region of the string of memory cells. When a cell passes the program verify operation, the programmed threshold voltage appears to be higher due to the trapped charge in the tunnel oxide layer. When the memory cell is later read after the programming operation has been completed, however, the cell can have a threshold voltage that is lower than the threshold voltage obtained during the program verify operation due to the charge in the tunnel oxide layer leaking out to the channel region. This can require an enlargement of the threshold voltage distribution in order to accommodate all possible threshold voltages for a given state and can lead to a higher error rate occurring during any subsequent read operation.

Certain memory devices attempt to detect quick charge loss by measuring a change in string resistance and calibrating selected and unselected wordline voltages applied during a read operation to compensate for the quick charge loss. Such techniques are adequate when the block of the memory device being read is fully programmed (i.e., is a "closed" block). The introduction of a zone named spaces (ZNS) feature in certain memory devices, however, creates the possibility of blocks in the memory device that are not fully programmed (i.e., "open" blocks). An open block is a partially programmed block. The string resistance in an open block can differ from fully programmed blocks due to the presence of erased memory cells. Many quick charge loss detection techniques cannot detect whether the string resistance change is due to quick charge loss or due to the presence of an open block. Thus, the memory devices may erroneously calibrate for threshold voltage shift due to quick charge loss, when in actuality the string resistance change occurs because of an open block (which does not require voltage compensation). Performing a read operation with erroneously calibrated voltage signals being applied to selected and unselected wordlines can impact reliability of the memory device, leading to higher error rates and decreased performance.

Aspects of the present disclosure address the above and other deficiencies by providing a detection scheme to measure a change in string resistance in a block of a memory device and determine whether the change in string resistance is attributable to quick charge loss in the memory cells of the string or to the presence of an open block. Upon determining that the change in string resistance is due to quick charge loss, the memory device can determine an associated amount of offset to be applied to the selected wordline voltage and unselected wordline voltage applied to the memory device during a read operation. In one embodiment, the memory array of the memory device includes a bitline precharge path connected to a current supply. The output voltage on this path (i.e., "vreg2") can be applied to a comparator and compared against a reference voltage (i.e., "vref") to trip a flag when the output voltage reaches the reference voltage. During calibration, if the string resistance in the block decreases, due to either quick charge loss or the presence of an open block, the output voltage will also decrease. In one embodiment, to perform the detection and make the determination, the memory device ramps the voltage applied to all wordlines of the block to a certain voltage (e.g., an unselected wordline voltage) and slowly steps up the reference voltage until it reaches the output voltage and the flag is tripped (e.g., from high to low). After the flag is tripped the memory device steps up the reference voltage by a larger fixed amount (which is independent of string characteristics) and starts ramping down the voltage applied to the selected wordline only until the flag is tripped again. If the voltage applied to the selected wordline at the point at which the flag is tripped for the second time is different than an expected value (e.g., a value measured immediately after the block was programmed), the memory device can determine that quick charge loss has occurred in the block and can compensate for such by adjusting the read voltages. If the voltage applied to the selected wordline at the point at which the flag is tripped for the second time is the same as the expected value (e.g., within a threshold amount), the memory device can determine that no read voltage compensation is necessary.

Advantages of this approach include, but are not limited to, improved performance in the memory device. In the manner described herein, the memory device can successfully identify instances of quick charge loss and differentiate those instances from the mere presence of an open block. This allows the memory device to properly compensate for the quick charge loss by modifying the voltages applied to selected and unselected wordlines during a subsequently performed read operation. This leads to a lower error rate, and improved reliability and data retention in the memory device. Accordingly, the overall quality of service level of the memory sub-system is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory device access management component 113 that can oversee, control, and/or manage data access operations, such as read operations, performed on a non-volatile memory device, such as memory device 130, of memory sub-system 110. Access management component 113 is responsible for applying certain voltages (or indicating which voltages to apply) to memory device 130 during the access operations. In addition, access management component 113 can also perform associated calibration operations to determine the proper voltages to be applied during the access operations. For example, prior to performing a read operation on memory device 130, access management component 113 can perform a calibration operation to measure a change in string resistance in a block of an array of memory device 130 and determine whether the change in string resistance is attributable to quick charge loss in the memory cells of the string or to the presence of an open block. Upon determining that the change in string resistance is due to quick charge loss, access management component 113 can determine an associated amount of offset to be applied to a selected wordline voltage and an unselected wordline voltage applied to the memory array during a read operation (i.e., a calibrated read voltage levels). If it is determined that the change in string resistance is not due to quick charge loss and is attributable to the presence of an open block, access management component can determine that no read voltage compensation is necessary and can perform the read operation using default voltage levels.

In one embodiment, access management component 113 determines, at a first time occurring after a selected wordline of the plurality of wordlines is programmed, a first magnitude of a voltage applied to the selected wordline of the plurality of wordlines when a first change in an output voltage (e.g., vreg2) of the memory array equals a first set amount. Access management component 113 further determines, at a second time occurring before the selected wordline of the plurality of wordlines is read, a second magnitude of the voltage applied to the selected wordline of the plurality of wordlines when a second change in the output voltage (e.g., vreg2) of the memory array equal the first set amount. In addition, access management component 113 determines whether the second magnitude is less than the first magnitude, and responsive to determining that the second magnitude is less than the first magnitude, determines that charge loss has occurred on at least one memory cell associated with the selected wordline. Further details with regards to the operations of the access management component 113 are described below.

Figure 2A:
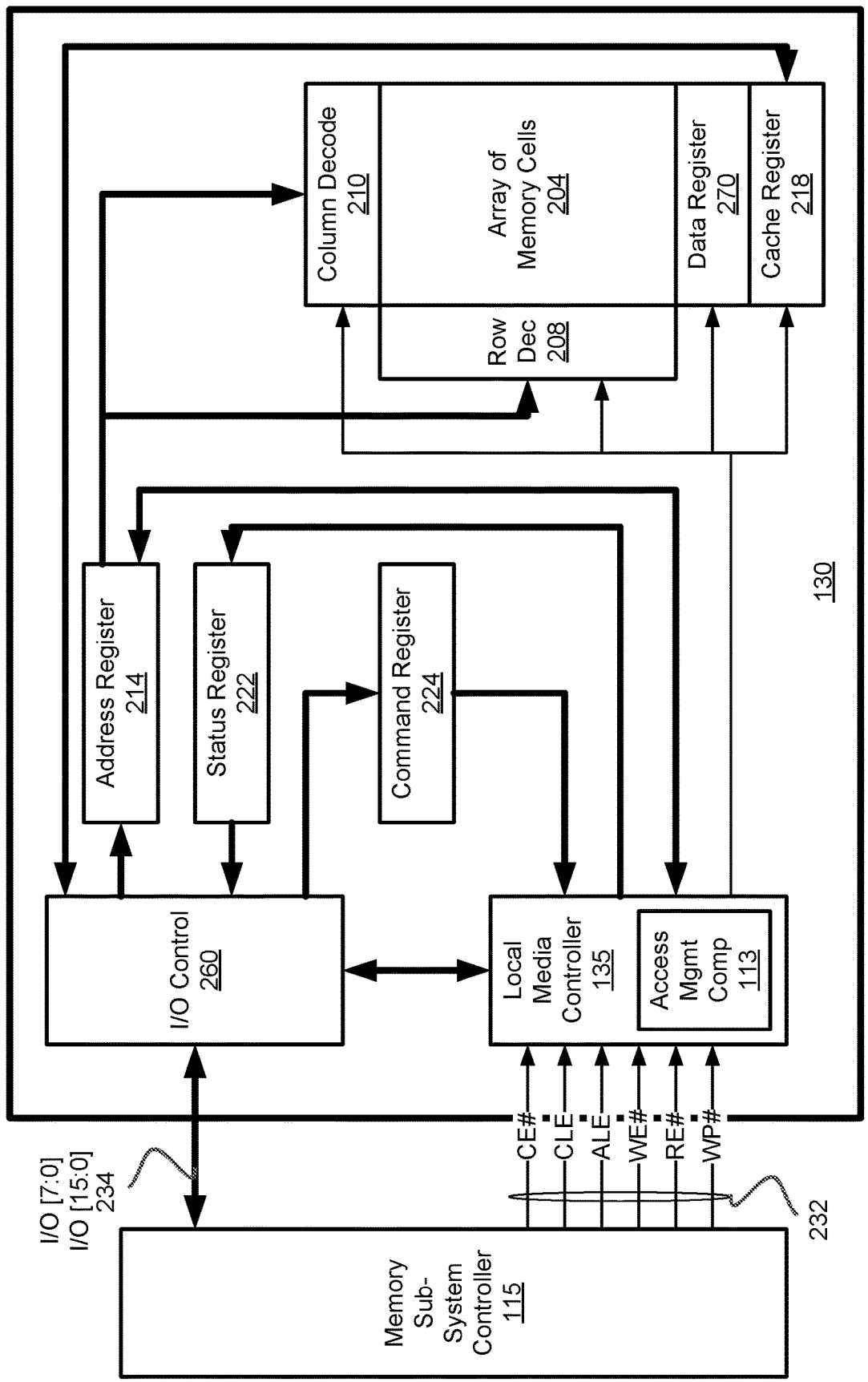
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 134 includes access management component 113, which can implement testing and calibration for charge loss compensation during read operations in a memory device in memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2A) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
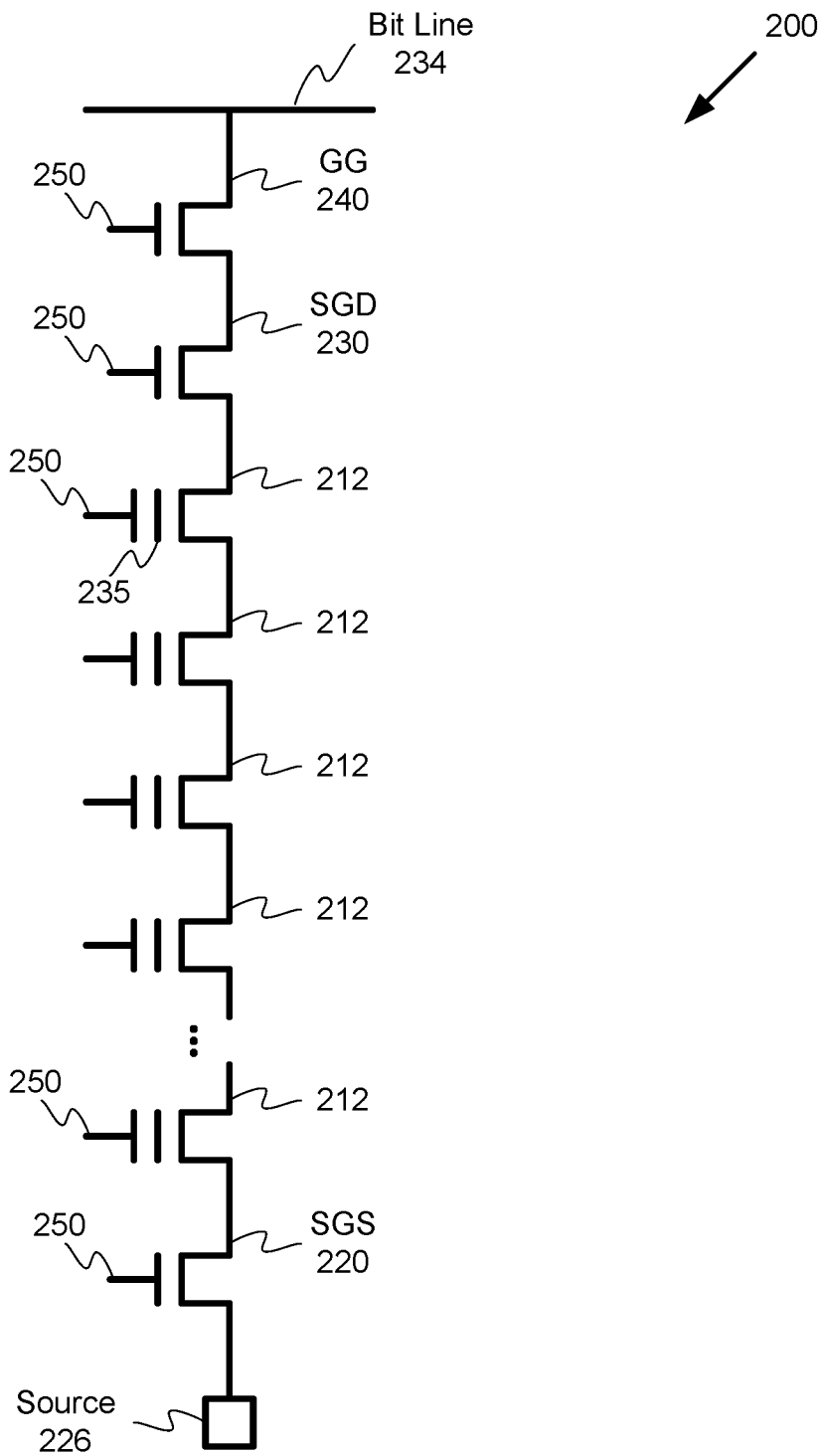
FIG. 2B is a schematic diagram illustrating a string of memory cells in a data block of a memory device in a memory sub-system in accordance with some embodiments of the present disclosure.

FIG. 2B is a schematic diagram illustrating a string 200 of memory cells in a data block of a memory device in a memory sub-system in accordance with some embodiments of the present disclosure. In one embodiment, the string 200 is representative of one portion of memory device 130, such as from array of memory cells 204, as shown in FIG. 2A. The string 200 includes a number of memory cells 212 (i.e., charge storage devices), such as up to 32 memory cells (or more) in some embodiments. The string 200 includes a source-side select transistor known as a source select gate 220 (SGS) (typically an n-channel transistor) coupled between a memory cell 212 at one end of the string 200 and a common source 226. The common source 226 may include, for example, a commonly doped semiconductor material and/or other conductive material. At the other end of the string 200, a drain-side select transistor called a drain select gate 230 (SGD) (typically an n-channel transistor) and a gate induced drain leakage (GIDL) generator 240 (GG) (typically an n-channel transistor) are coupled between one of the memory cells 212 and a data line 234, which is commonly referred to in the art as a "bit line." The common source 226 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 212 may include, for example, a floating gate transistor or a charge trap transistor and may comprise a single level memory cell or a multilevel memory cell. The floating gate may be referred to as a charge storage structure 235. The memory cells 212, the source select gate 220, the drain select gate 230, and the GIDL generator 240 can be controlled by signals on their respective control gates 250.

The control signals can be applied by access management component 113, or at the direction of access management component 113, to select lines (not shown) to select strings, or to access lines (not shown) to select memory cells 212, for example. In some cases, the control gates can form a portion of the select lines (for select devices) or access lines (for cells). The drain select gate 230 receives a voltage that can cause the drain select gate 230 to select or deselect the string 200. In one embodiment, each respective control gate 250 is connected to a separate word line (i.e., access line), such that each device or memory cell can be separately controlled.

In one embodiment, in order to detect charge loss in a memory device or memory devices that form part of string 200, prior to performing an operation, access management component 113 can perform a calibration operation to measure a change in string resistance of strung 200 and determine whether the change in string resistance is attributable to quick charge loss in the memory cells of string 200 or to the presence of an open block. The specific application of the signals to string 200 can vary depending on the implementation, as is described in more detail below.

Figure 3:
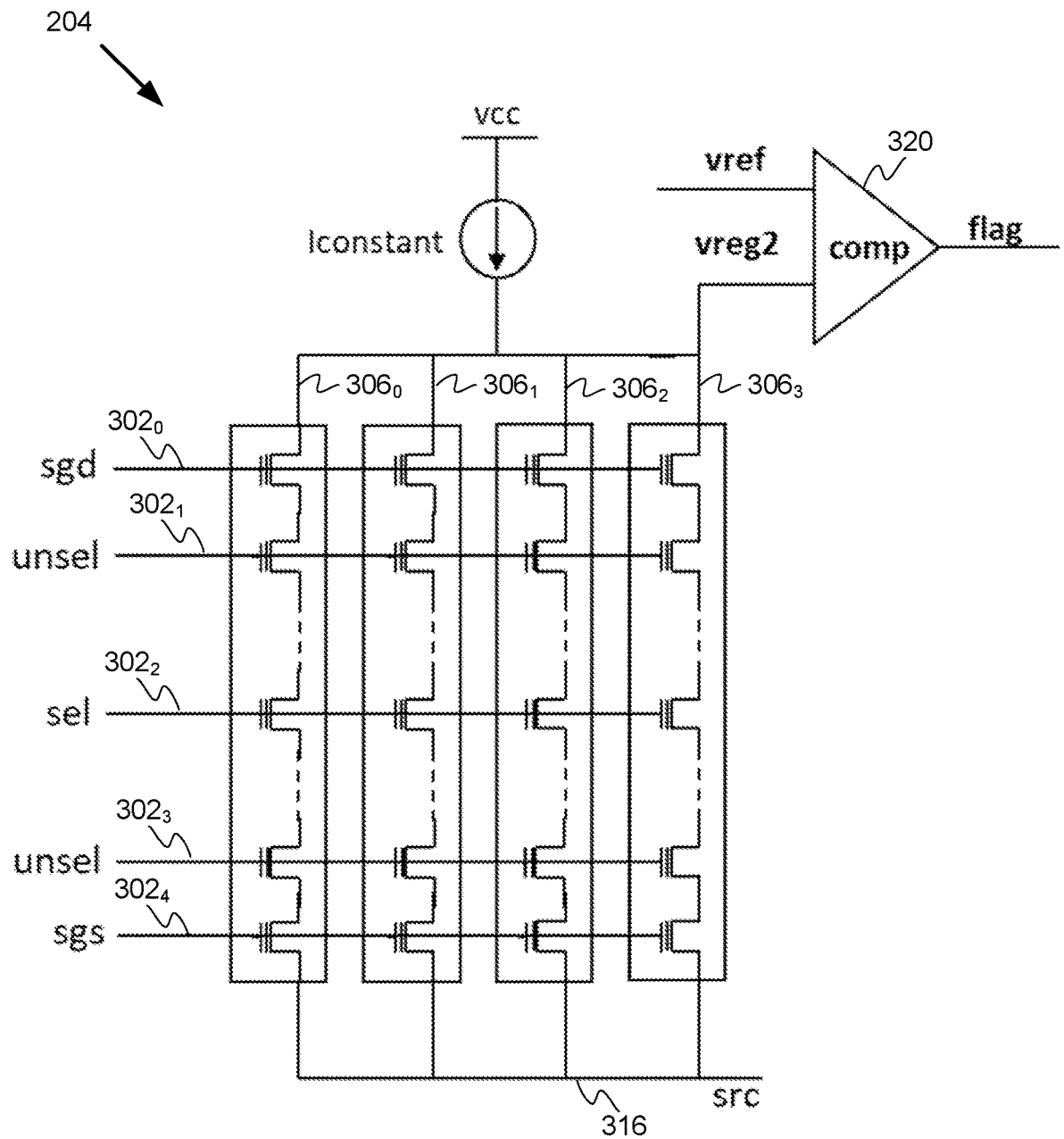
FIG. 3 is a schematic of a portion of an array of memory cells, such as a NAND memory array of a memory device in a memory sub-system in accordance with some embodiments of the present disclosure.

FIG. 3 is a schematic of a portion of an array of memory cells 204, such as a NAND memory array, as could be used in a memory device of the type described with reference to FIG. 2A according to an embodiment. Memory array 204 includes access lines, such as word lines $302_0$ to $302_4$, and data lines, such as bitlines. The word lines 302 can be connected to global access lines (e.g., global word lines), not shown in FIG. 3, in a many-to-one relationship. For some embodiments, memory array 204 can be formed over a semiconductor that, for example, can be conductively doped to have a conductivity type, such as a p-type conductivity, e.g., to form a p-well, or an n-type conductivity, e.g., to form an n-well.

Memory array 204 can be arranged in rows (each corresponding to a word line 302) and columns (each corresponding to a bitline). Each column can include a string of series-connected memory cells (e.g., non-volatile memory cells), such as one of NAND strings $206_0$ to $206_3$. Each NAND string 206 can be connected (e.g., selectively connected) to a common source (SRC) 316 and can include a number of memory cells. The memory cells can represent non-volatile memory cells for storage of data. The memory cells of each NAND string 206 can be connected in series between a select gate (e.g., a field-effect transistor) that can be a source select transistor, commonly referred to as a select gate source (SGS), and a select gate that can be a drain select transistor, commonly referred to as select gate drain (SGD). The source select gates can be commonly connected to a select line $302_4$, such as a source select line (SGS), and the drain select gates can be commonly connected to a select line $302_0$, such as a drain select line (SGD). Although depicted as traditional field-effect transistors, the select gates can utilize a structure similar to (e.g., the same as) the memory cells. The select gates can represent a number of select gates connected in series, with each select gate in series configured to receive a same or independent control signal.

A source of each select gate can be connected to common source 316. The drain of each source select gate can be connected to a memory cell of the corresponding NAND string 306. Therefore, each source select gate can be configured to selectively connect a corresponding NAND string 306 to the common source 316. The drain of each drain select gate can be connected to the bitline for the corresponding NAND string 206. The source of each drain select gate can be connected to a memory cell of the corresponding NAND string 206. Therefore, each drain select gate can be configured to selectively connect a corresponding NAND string 206 to the corresponding bitline.

The memory array 204 in FIG. 3 can be a quasi-two-dimensional memory array and can have a generally planar structure, e.g., where the common source 316, NAND strings 306 and bitlines extend in substantially parallel planes. Alternatively, the memory array 204 in FIG. 3 can be a three-dimensional memory array, e.g., where NAND strings 206 can extend substantially perpendicular to a plane containing the common source 316 and to a plane containing the bitlines that can be substantially parallel to the plane containing the common source 316.

Typical construction of memory cells includes a data-storage structure (e.g., a floating gate, charge trap, and the like) that can determine a data state of the memory cell (e.g., through changes in threshold voltage), and a control gate, as shown in FIG. 3. The data-storage structure can include both conductive and dielectric structures while the control gate is generally formed of one or more conductive materials. In some cases, memory cells can further have a defined source and drain. The memory cells have their control gates connected to (and in some cases form) a word line 302.

A column of the memory cells can be a NAND string 306 or a number of NAND strings 306 selectively connected to a given bitline. A row of the memory cells can be commonly connected to a given word line 302. A row of memory cells can, but need not, include all the memory cells commonly connected to a given word line 302. Rows of the memory cells can often be divided into one or more groups of physical pages of memory cells, and physical pages of the memory cells often include every other memory cell commonly connected to a given word line 302. For example, the memory cells commonly connected to word line $302_1$ and selectively connected to even bitlines can be one physical page of the memory cells (e.g., even memory cells) while memory cells commonly connected to word line $302_1$ and selectively connected to odd bitlines can be another physical page of the memory cells (e.g., odd memory cells).

Other groupings of the memory cells commonly connected to a given word line 302 can also define a physical page of memory cells. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines 302 (e.g., all NAND strings 206 sharing common word lines 202). Unless expressly distinguished, a reference to a page of memory cells herein refers to the memory cells of a logical page of memory cells. Although the example of FIG. 3 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

In one embodiment, an output voltage (i.e., vreg2) at the drain end of each of memory string 306 is collected and provided to one input to comparator 320. A reference voltage (i.e., vref) is provided to another input of comparator 320. A comparator output (i.e. flag) of comparator 320 changes state when the output voltage (i.e., vreg2) reaches the reference voltage (i.e., vref). For example, if the comparator output (i.e., flag) is currently a voltage in a high state and the output voltage (i.e., vreg2) is presently higher than the reference voltage (i.e., vref), once the output voltage (i.e., vreg2) decreases and/or the reference voltage (i.e., vref) increases such that the output voltage (i.e., vreg2) is equal to or less than the reference voltage (i.e., vref), the comparator output (i.e., flag) can switch to voltage in a low state. Once the output voltage (i.e., vreg2) increases again and/or the reference voltage (i.e., vref) decreases again such that the output voltage (i.e., vreg2) is equal to or greater than the reference voltage (i.e., vref) again, the comparator output (i.e., flag) can switch back to the voltage in the high state.

Figure 4:
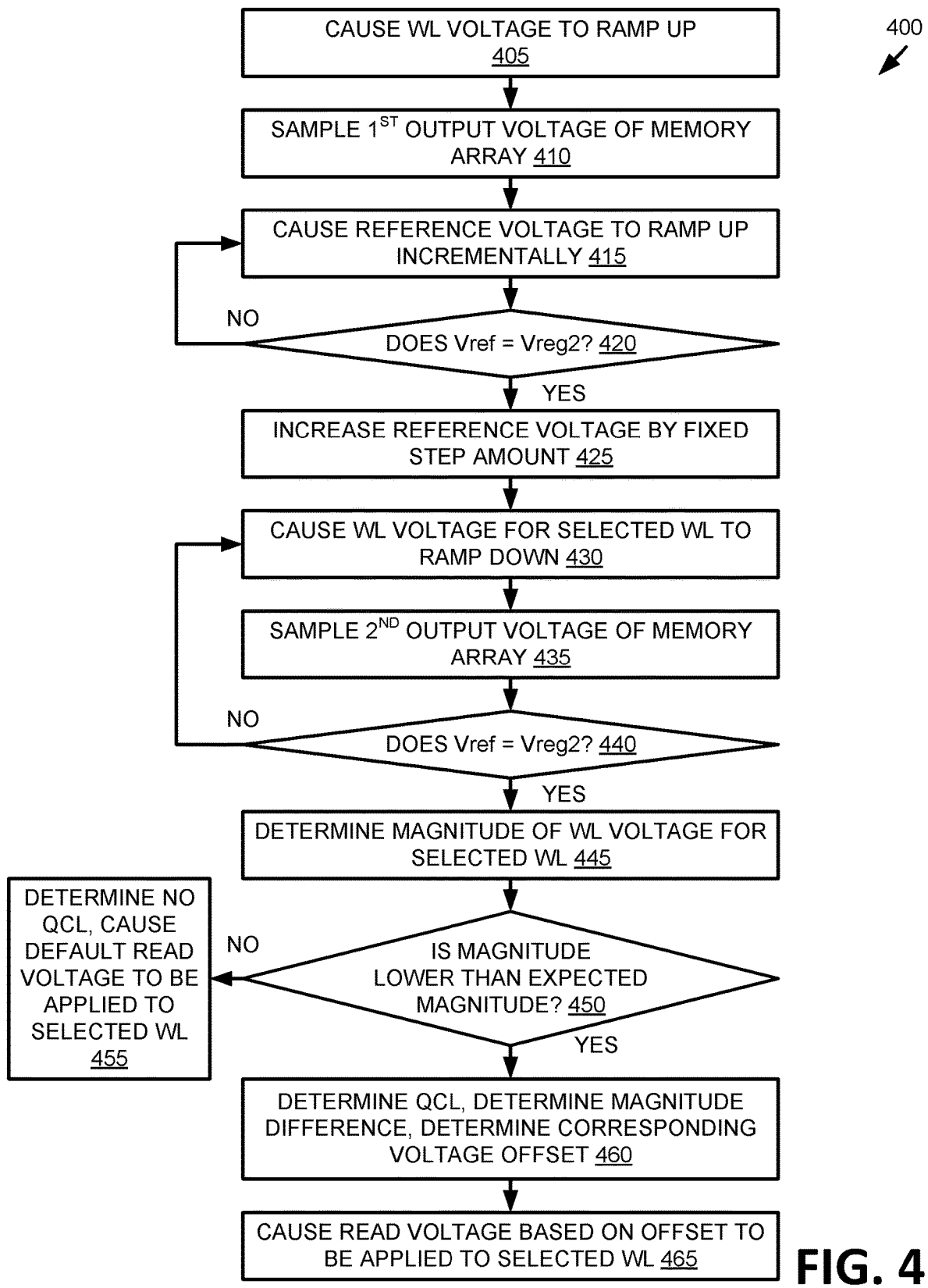
FIG. 4 is a flow diagram of an example method of charge loss compensation during read operations in a memory device in accordance with some embodiments of the present disclosure.

FIG. 4 is a flow diagram of an example method of charge loss compensation during read operations in a memory device in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by access management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 5:
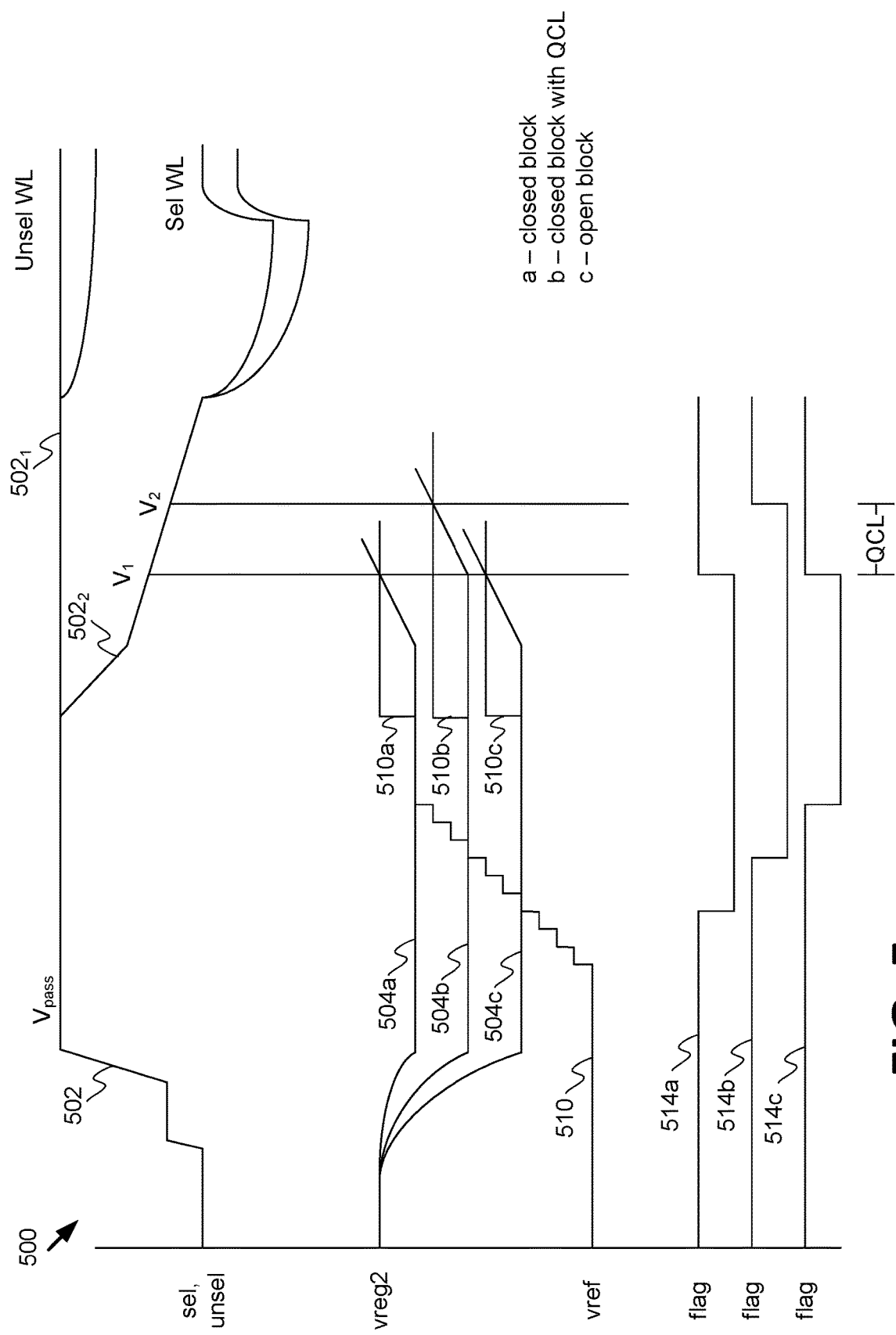
FIG. 5 is a timing diagram for operation of a memory device implementing charge loss compensation during read operations in the memory device in accordance with some embodiments of the present disclosure.

At operation 405, a wordline voltage is ramped up. For example, processing logic (e.g., access management component 113) can cause a voltage applied to the wordlines of a memory array, such as wordlines $302_0$-$302_4$ of memory array 204 of memory device 130, to ramp up to a certain voltage, such as an unselected wordline voltage. As shown in FIG. 5, the voltage signal 502 is applied to each of the wordlines of memory array 204, including both a selected wordline (i.e., a wordline on which a memory access operation, such as a read operation, is to be performed) and unselected wordlines (i.e., the remaining wordlines on which a memory access operation is not being performed). In one embodiment, the unselected wordline voltage is a pass voltage (i.e., Vpass), although the specific magnitude can vary.

At operation 410, an output voltage is sampled. For example, the processing logic can sample a first output voltage (i.e., vreg2) of the memory array 204. As described above, the output voltage (i.e., vreg2) can be representative of a bitline voltage in memory array 204 and can be sampled at a node connected to each of multiple memory strings, such as strings $306_0$-$306_3$ in the memory array 204. As shown in FIG. 5, the output voltage (i.e., vreg2) signal 504 can vary depending on the state of the block being read. For example, signal 504a can represent the output voltage (i.e., vreg2) of a closed block (i.e., a block that is fully written), signal 504b can represent the output voltage of an open block (i.e., a block that is only partially written), and signal 504c can represent the output voltage of a closed block suffering from quick charge loss (QCL). The magnitude of the output voltage signal 504 alone, however, is not indicative of the state of the block being read.

At operation 415, a reference voltage is ramped up. For example, the processing logic can cause a reference voltage (i.e., vref) to change incrementally (e.g., ramp up or ramp down) over a first period of time. In one embodiment, the reference voltage (i.e., vref) is received from a voltage source either within or external to memory device 130, and is applied as an input to comparator 320, along with the output voltage (i.e., vreg2) sampled at operation 410. As shown in FIG. 5, the magnitude of the reference voltage signal 510 can be periodically stepped up in increments of a fixed size. In other embodiments, the reference voltage signal could begin at a higher level and be periodically stepped down over time.

At operation 420, a determination is made. For example, the processing logic can determine whether the reference voltage (i.e. vref) is equal to the output voltage (i.e., vreg2). In one embodiment, the output of comparator 320 will change state (e.g., from a high state to a low state) when the inputs are equal, thereby tripping a "flag" signal to notify access management component 113. As shown in FIG. 5, when the output voltage signal 504 equals the reference voltage signal 510, a flag signal 514 will change state. Depending on whether the output voltage (i.e., vref2) is 504a, 504b, or 504c, the flag signal will change state at a respective time, as shown by flag signals 514a, 514b, or 514c. If the reference voltage (i.e., vref) is not equal to the output voltage (i.e., vreg2), the processing logic continues to cause the reference voltage to ramp up incrementally at operation 415.

If the reference voltage (i.e. vref) is equal to the output voltage (i.e., vreg2), at operation 425, the reference voltage is changed. For example, the processing logic can changed (e.g., increase or decrease) the reference voltage by a fixed step amount. As shown in FIG. 5, regardless of the voltage magnitude at which the reference voltage signal 510 reaches any of the output voltage signals 504a, 504b, or 504c, subsequently, the reference voltage signal 510 is incremented by the same fixed step amount, as shown by the resulting reference voltage signals 510a, 510b, or 510c. In one embodiment, the fixed step amount is larger (e.g., 4×larger) than the increments used to ramp up the reference voltage signal 510 at operation 415. In one embodiment, the fixed step amount is used to ensure that a comparison can be made when a change in the output voltage of the memory array is equal to a set amount for different states of the block being read (e.g., closed block, open block, or closed block with QCL). In other embodiments, rather than increasing the reference voltage by a fixed step amount, the processing logic can instead decrease the reference voltage by the fixed step amount.

At operation 430, a wordline voltage is ramped down. For example, the processing logic can cause a voltage applied to a selected wordline to ramp down. As shown in FIG. 5, the voltage signal $502_2$ applied to a selected wordline, such as wordline $302_2$, of memory array 204 is ramped down to a lower magnitude, while a voltage signal $502_1$ applied to unselected wordlines, such as wordlines $302_1$ and $302_3$ remains at the unselected wordline voltage.

At operation 435, an output voltage is sampled. For example, the processing logic can sample a second output voltage (i.e., vreg2) of the memory array 204 after the selected wordline voltage signal $502_2$ has been ramped down. As described above, the output voltage (i.e., vreg2) can be representative of a bitline voltage in memory array 204 and can be sampled at a node connected to each of multiple memory strings, such as strings $306_0$-$306_3$ in the memory array 204. As shown in FIG. 5, the output voltage (i.e., vreg2) signal 504a, 504b, or 504c can vary depending on the state of the block being read.

At operation 440, a determination is made. For example, the processing logic can determine whether the reference voltage (i.e. vref) increased by the fixed step amount is equal to the output voltage (i.e., vreg2). In one embodiment, the output of comparator 320 will change state (e.g., from a high state to a low state) when the inputs are equal, thereby tripping a "flag" signal to notify access management component 113. As shown in FIG. 5, when the output voltage signal 504a, 504b, or 504c equals the reference voltage signal increased by the fixed step amount 510a, 510b, or 510c, a corresponding flag signal 514a, 514b, or 514c will change state. If the reference voltage increased by the fixed step amount (i.e., vref) is not equal to the output voltage (i.e., vreg2), the processing logic continues to cause the wordline voltage signal $502_2$ to ramp down at operation 430.

If the reference voltage (i.e. vref) increased by the fixed step amount is equal to the output voltage (i.e., vreg2), at operation 445, a magnitude is determined. For example, the processing logic can determine a magnitude of the voltage applied to the selected wordline at the time when the reference voltage (i.e. vref) increased by the fixed step amount equals the output voltage (i.e., vreg2). As shown in FIG. 5, the time when the reference voltage (i.e. vref) increased by the fixed step amount equals the output voltage (i.e., vreg2) varies depending on the state of the block being read, as does the magnitude of voltage signal $502_2$. For example, the reference voltage signal 510a equals the output voltage 504a and the reference voltage signal 510c equals the output voltage 504c when the magnitude of voltage signal $502_2$ is $V_1$, but the reference voltage signal 510b equals the output voltage 504b when the magnitude of voltage signal $502_2$ is a lower voltage $V_2$.

At operation 450, a determination is made. For example, the processing logic can determine whether the magnitude of the voltage signal $502_2$ applied to the selected wordline $302_2$ at the time when the reference voltage (i.e. vref) increased by the fixed step amount equals the output voltage (i.e., vreg2) is lower than an expected magnitude. In one embodiment, the expected magnitude is the voltage $V_1$ and is determined based on a magnitude of the voltage signal $502_2$ at an earlier time when the reference voltage increased by the fixed step amount is equal to the output voltage of the memory array immediately after the selected wordline was programmed. Since a limited amount of time has passed since the selected wordline was programmed, there has not been enough time for quick charge loss to have occurred.

Thus, if it is determined that the magnitude of the voltage signal $502_2$ is equal to (i.e., not less than) the expected magnitude (e.g., $V_1$), at operation 455 the processing logic can determine that no charge loss has occurred. In one embodiment, access management component 113 can perform a read operation using default read voltage levels to read the data from the memory array 204.

If, however, it is determined that the magnitude of the voltage signal $502_2$ (e.g., $V_2$) is less than the expected magnitude (e.g., $V_1$), at operation 460 the processing logic can determine that quick charge loss has occurred. In one embodiment, access management component 113 can determine an amount by which the magnitude of the voltage applied to the selected wordline at the time when the reference voltage changed by the fixed step amount is equal to the second output voltage of the memory array is lower than the expected magnitude (e.g. $V_1$-$V_2$) and determine a voltage offset corresponding to the amount. For example, access management component 113 can consult a lookup table maintained in memory device 130 containing a number of entries, each mapping a respective difference to a corresponding voltage offset.

At operation 465, a read operation is performed. For example, the processing logic can cause a read voltage having a magnitude based on the voltage offset to be applied to the selected wordline to perform the read operation. As shown in FIG. 5, both the voltages applied to the selected wordline (i.e., a read voltage) and to the unselected wordlines (i.e., a pass voltage) can be calibrated using the voltage offset determined at operation 460.

Figure 6:
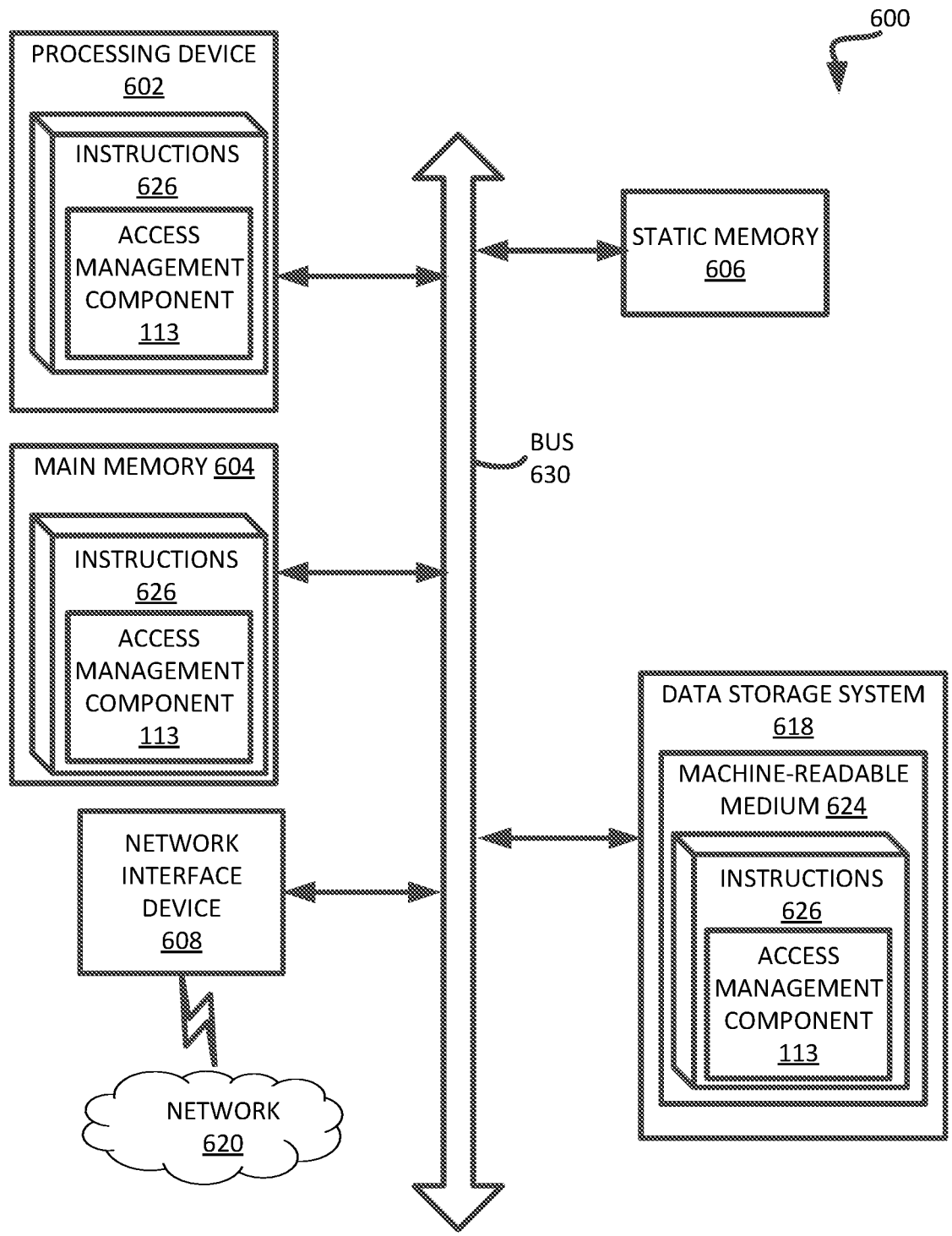
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the access management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the access management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a plurality of wordlines; and
control logic, operatively coupled with the memory array, to perform operations comprising:
 initiating a read operation on the memory array;
 performing a calibration operation to detect a change in string resistance in the memory array;
 determining whether the change in string resistance is attributable to charge loss in the memory array or a presence of a partially programmed block in the memory array; and
 responsive to determining that the change in string resistance is attributable to charge loss in the memory array, preforming the read operation using calibrated read voltage levels to read data from the memory array.

2. The memory device of claim 1, wherein performing the calibration operation comprises:
causing a voltage applied to the plurality of wordlines to ramp up to an unselected wordline voltage;
sampling a first output voltage of the memory array;
causing a reference voltage to change incrementally over a first period of time; and
determining that the reference voltage is equal to the first output voltage of the memory array.

3. The memory device of claim 2, wherein performing the calibration operation further comprises:
changing the reference voltage by a fixed step amount;
causing a voltage applied to a selected wordline of the plurality of wordlines to ramp down;
sampling a second output voltage of the memory array; and
determining that the reference voltage changed by the fixed step amount is equal to the second output voltage of the memory array.

4. The memory device of claim 3, wherein determining whether the change in string resistance is attributable to charge loss in the memory array comprises:
determining a magnitude of the voltage applied to the selected wordline at a time when the reference voltage changed by the fixed step amount is equal to the second output voltage of the memory array;
determining whether the magnitude of the voltage applied to the selected wordline at the time when the reference voltage changed by the fixed step amount is equal to the second output voltage of the memory array is lower than an expected magnitude; and
responsive to determining that the magnitude of the voltage applied to the selected wordline at the time when the reference voltage changed by the fixed step amount is equal to the second output voltage of the memory array is lower than the expected magnitude, determining that the change in string resistance is attributable to charge loss in the memory array.

5. The memory device of claim 4, wherein preforming the read operation using calibrated read voltage levels to read data from the memory array comprises:
determining an amount by which the magnitude of the voltage applied to the selected wordline at the time when the reference voltage changed by the fixed step amount is equal to the second output voltage of the memory array is lower than the expected magnitude;
determining a voltage offset corresponding to the amount; and
causing a read voltage having a magnitude based on the voltage offset to be applied to the selected wordline to perform the read operation.

6. The memory device of claim 4, wherein the expected magnitude is based on a magnitude of the voltage applied to the selected wordline at an earlier time when the reference voltage changed by the fixed step amount is equal to a third output voltage of the memory array immediately after the selected wordline was programmed.

7. The memory device of claim 1, wherein the control logic is to perform operations further comprising:
responsive to determining that the change in string resistance is not attributable to charge loss in the memory array, preforming the read operation using default read voltage levels to read the data from the memory array.

8. A method comprising:
initiating a read operation on a memory array of a memory device;
performing a calibration operation to detect a change in string resistance in the memory array;
determining whether the change in string resistance is attributable to charge loss in the memory array or a presence of a partially programmed block in the memory array; and
responsive to determining that the change in string resistance is attributable to charge loss in the memory array, preforming the read operation using calibrated read voltage levels to read data from the memory array.

9. The method of claim 8, wherein performing the calibration operation comprises:
causing a voltage applied to a plurality of wordlines of the memory array to ramp up to an unselected wordline voltage;
sampling a first output voltage of the memory array;
causing a reference voltage to change incrementally over a first period of time; and
determining that the reference voltage is equal to the first output voltage of the memory array.

10. The method of claim 9, wherein performing the calibration operation further comprises:
changing the reference voltage by a fixed step amount;
causing a voltage applied to a selected wordline of the plurality of wordlines to ramp down;
sampling a second output voltage of the memory array; and
determining that the reference voltage changed by the fixed step amount is equal to the second output voltage of the memory array.

11. The method of claim 10, wherein determining whether the change in string resistance is attributable to charge loss in the memory array comprises:
determining a magnitude of the voltage applied to the selected wordline at a time when the reference voltage changed by the fixed step amount is equal to the second output voltage of the memory array;
determining whether the magnitude of the voltage applied to the selected wordline at the time when the reference voltage changed by the fixed step amount is equal to the second output voltage of the memory array is lower than an expected magnitude; and
responsive to determining that the magnitude of the voltage applied to the selected wordline at the time when the reference voltage changed by the fixed step amount is equal to the second output voltage of the memory array is lower than the expected magnitude, determining that the change in string resistance is attributable to charge loss in the memory array.

12. The method of claim 11, wherein preforming the read operation using calibrated read voltage levels to read data from the memory array comprises:
determining an amount by which the magnitude of the voltage applied to the selected wordline at the time when the reference voltage changed by the fixed step amount is equal to the second output voltage of the memory array is lower than the expected magnitude;
determining a voltage offset corresponding to the amount; and
causing a read voltage having a magnitude based on the voltage offset to be applied to the selected wordline to perform the read operation.

13. The method of claim 11, wherein the expected magnitude is based on a magnitude of the voltage applied to the selected wordline at an earlier time when the reference voltage changed by the fixed step amount is equal to a third output voltage of the memory array immediately after the selected wordline was programmed.

14. The method of claim 8, further comprising:
responsive to determining that the change in string resistance is not attributable to charge loss in the memory array, preforming the read operation using default read voltage levels to read the data from the memory array.

15. A memory device comprising:
a memory array comprising a plurality of wordlines; and
control logic, operatively coupled with the memory array, to perform operations comprising:
determining, at a first time occurring after a selected wordline of the plurality of wordlines is programmed, a first magnitude of a voltage applied to the selected wordline of the plurality of wordlines when a first change in an output voltage of the memory array equals a first set amount;
determining, at a second time occurring before the selected wordline of the plurality of wordlines is read, a second magnitude of the voltage applied to the selected wordline of the plurality of wordlines when a second change in the output voltage of the memory array equal the first set amount, wherein determining the second magnitude of the voltage applied to the selected wordline comprises:
causing a voltage applied to the plurality of wordlines to ramp up to an unselected wordline voltage;
sampling the output voltage of the memory array;
causing a reference voltage to change incrementally over a first period of time; and
determining that the reference voltage is equal to the output voltage of the memory array;
determining whether the second magnitude is less than the first magnitude; and
responsive to determining that the second magnitude is less than the first magnitude, determining that charge loss has occurred on at least one memory cell associated with the selected wordline.

16. The memory device of claim 15, wherein determining the second magnitude of the voltage applied to the selected wordline comprises:
changing the reference voltage by a fixed step amount;
causing a voltage applied to the selected wordline of the plurality of wordlines to ramp down;
sampling the output voltage of the memory array; and
determining that the reference voltage changed by the fixed step amount is equal to the output voltage of the memory array at the second time.

17. The memory device of claim 15, wherein the control logic is to perform operations further comprising:
determining an amount by which the second magnitude of is lower than the first magnitude;
determining a voltage offset corresponding to the amount; and
causing a read voltage having a magnitude based on the voltage offset to be applied to the selected wordline to perform a read operation.

18. The memory device of claim 15, wherein the control logic is to perform operations further comprising:
responsive to determining that the second magnitude equal to the first magnitude, determining that charge loss has not occurred on any memory cell associated with the selected wordline.

19. The memory device of claim 18, wherein the control logic is to perform operations further comprising:
responsive to determining that charge loss has not occurred on at least one memory cell associated with the selected wordline causing a read voltage having a default magnitude to be applied to the selected wordline to perform a read operation.

\* \* \* \* \*